United States Patent
Jin et al.

(10) Patent No.: US 6,386,432 B1
(45) Date of Patent: May 14, 2002

(54) SEMICONDUCTOR DIE PICKUP METHOD THAT PREVENTS ELECTROSTATIC DISCHARGE

(75) Inventors: Ho Tae Jin; Hee Kook Choi, both of Cheonan (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/710,517

(22) Filed: Nov. 10, 2000

Related U.S. Application Data

(62) Division of application No. 09/172,715, filed on Oct. 13, 1998, now Pat. No. 6,321,971.

(30) Foreign Application Priority Data

Oct. 22, 1997 (KR) .............................................. 97-54137

(51) Int. Cl.[7] ................................................. B23K 31/02
(52) U.S. Cl. ...................... 228/245; 228/180.22; 29/743
(58) Field of Search ......................... 228/6.2, 212, 6.1, 228/4.1, 44.7, 21, 205, 180.22, 221, 218; 294/64.1, 902; 29/740, 743; 269/21

(56) References Cited

U.S. PATENT DOCUMENTS

| | | | |
|---|---|---|---|
| 3,811,182 A | 5/1974 | Ryan, Sr. et al. ............. | 29/574 |
| 4,185,814 A | 1/1980 | Buchmann et al. | |
| 4,634,043 A | 1/1987 | Avedissian ............... | 228/180.2 |
| 4,875,279 A | 10/1989 | Sakiadis | |
| 5,049,084 A | 9/1991 | Bakke ......................... | 439/66 |
| 5,169,196 A | 12/1992 | Safabakhsh ................ | 294/64.3 |
| 5,639,323 A | 6/1997 | Jordan ................... | 228/180.21 |
| 5,654,204 A | 8/1997 | Anderson ..................... | 438/15 |
| 5,765,277 A | 6/1998 | Jin et al. ..................... | 29/734 |
| 5,839,769 A | 11/1998 | Slocum et al. ............. | 294/87.1 |
| 5,877,534 A | 3/1999 | Williams et al. ............ | 257/355 |
| 5,943,254 A | 8/1999 | Bakeman, Jr. et al. ........ | 365/72 |
| 5,983,477 A | 11/1999 | Jacks et al. | |
| 6,068,317 A * | 5/2000 | Park | |
| 6,152,506 A | 11/2000 | Narikiyo et al. | |
| 6,196,439 B1 | 3/2001 | Mays et al. | |

\* cited by examiner

*Primary Examiner*—Tom Dunn
*Assistant Examiner*—Jonathan Johnson
(74) *Attorney, Agent, or Firm*—Skjerven Morrill MacPherson LLP; David W. Heid

(57) ABSTRACT

An embodiment of the present invention provides a pickup tool in accordance with the present invention includes multiple contact parts, which contact a passivation layer of a semiconductor chip so that the contact parts are far from chip pads and fuses when holding the semiconductor chip. Furthermore, a die bonding apparatus has one or two pickup tools, an aligning stage, and a bond stage or a bond head.

5 Claims, 5 Drawing Sheets

SEMICONDUCTOR DIE PICKUP METHOD THAT PREVENTS ELECTROSTATIC DISCHARGE

This application is a divisional of Ser. No 09/172,715 filed Oct. 13, 1998, now U.S. Pat. No. 6,321,971.

BACKGROUND OF THE INVENTION

1. Field of the Invention

The present invention relates to an apparatus for manufacturing semiconductor integrated circuit devices, and more specifically to a semiconductor die bonding apparatus having a die pickup tool with multiple contact parts for preventing electrostatic discharge from damaging the semiconductor integrated circuit devices during the manufacturing process.

2. Description of the Prior Art

In manufacturing semiconductor integrated circuit (IC) devices, a semiconductor wafer which includes a number of semiconductor chips is produced. Then, the assembly of the semiconductor chips starts with a sawing step which separates the semiconductor wafer into individual semiconductor chips. After the sawing, a die bonding step bonds the semiconductor chips to a lead frame. A die bonding apparatus picks up the semiconductor chips by using a tool which is commonly called a pickup collet, a transfer collet or a bond collet.

FIG. 1 shows a conventional pickup collet 10. As shown in FIG. 1, pickup collet 10 includes a collet body 12 and a vacuum line 14. A hole 16 in collet body 12 extends through vacuum line 14 and is used to create a vacuum. As used herein, the term "vacuum" includes any pressure less than the ambient pressure that will cause a chip to be held against the pickup collet. This vacuum holds a semiconductor chip such as semiconductor chip 20 of FIG. 2 in to a contact part 18 of collet 10, and blowing air or nitrogen gas through hole 16 releases semiconductor chip 20 from collet 10.

During the manufacture of semiconductor devices, the equipment or operator often produces an electrostatic discharge (ESD), and the electrostatic discharge can damage semiconductor chip 20 by causing a breakdown of the insulation or breakdown of integrated circuits. In particular, pickup collet 10 is one of the most noticeable sources of electrostatic discharge.

A top surface 28 of semiconductor chip 20 is, as depicted in FIG. 2, covered with a passivation layer 22 for protecting circuits. However, chip pads 24 and fuses 26, which are made of a metal such as aluminum, should be exposed for wire-bonding and repairing semiconductor chip 20 according to the results of electrical die sorting, respectively. Therefore, when collet 10 picks up semiconductor chip 20, chip pads 24 and fuses 26 are in close proximity, without any interposer, to contact part 18 of collet 10, as illustrated in FIG. 2. The dashed lines in FIG. 2 show the area where contact part 18 contacts top surface 28 of semiconductor chip 20. Accordingly, chip pads 24 and fuses 26 became susceptible to ESD damage.

Two typical examples of electrostatic discharge caused by using conventional pickup collet 10 are shown in FIGS. 3 and 4, which are cross-sectional views taken along the line III—III of FIG. 2. FIG. 3 depicts the alignment of semiconductor chip 20 on an aligning stage 30 before bonding chip 20 to a lead frame, and FIG. 4 depicts the picking up of semiconductor chip 20 from a sawed wafer 50 attached to a sawing tape 40.

Referring to FIG. 3, when collet 10 places semiconductor chip 20 on aligning stage 30, air or nitrogen gas is blown through vacuum line 14 to release semiconductor chip 20 from collet 10. However, since the air or nitrogen gas is easily charged with electrons, it is highly probable that a sudden stream of electric charges in the air or gas flows through chip pads 24 and fuses 26 to aligning stage 30. This electrostatic discharge current generates heat, passing through low resistive path of semiconductor chip 20, and the heat often causes the melting of gate polysilicon around the fuses 26, the breakdown of circuits or the destruction of chip pads 24. This problem becomes more serious when collet 10 is electrically nonconductive, and aligning stage 30 is electrically conductive.

FIG. 4 shows another example of ESD damage that arises when collet 10 is electrically conductive. As seen from FIG. 4, a combined operation of collet 10 and plunger 42 separates semiconductor chip 20 from sawing tape 40. While plunger 42 pushes up semiconductor chip 20, collet 10 picks up semiconductor chip 20. During this operation, electrostatic discharge forms in the wedge-shaped gap between sawing tape 40 and semiconductor chip 20, and flows to collet 10 via chip pads 24 and fuses 26 that are very close to contact part 18 of collet 10.

Damage to semiconductor chips from electrostatic discharge is likely to become a more serious problem in light of the continuing trend to higher circuit integration and narrower pattern width. One approach to solve the problem associated with electrostatic discharge is to cover the fuses with the passivation layer after repairing semiconductor wafers. However, this approach requires high level of cleanness in the electrical die sorting and consequently additional manufacturing costs. Besides, the chip pads should be exposed for wire-bonding.

Another approach modifies the architecture of the circuits so that each fuse is connected to an extra capacitor to prevent electrostatic discharge. However, this approach also increases the manufacturing cost.

SUMMARY OF THE INVENTION

According to the present invention, a pickup tool has multiple contact parts, and the pickup tool may be included in a die bonding apparatus. The die bonding apparatus picks up a semiconductor chip and bonds it to a lead frame by using the pickup tool, which includes a body and a vacuum line connected to the body. The vacuum line is used for creating a vacuum between the semiconductor chip and the pickup tool.

In particular, the pickup tool includes multiple contact parts which protrude outwardly from the body, and each contact part has a vacuum hole which communicates with the vacuum line. Therefore, a vacuum is created between the semiconductor chip and the contact parts, so that the contact parts hold the semiconductor chip. The contact parts are positioned so that the contact parts contact the passivation layer, and not close to the exposed chip pads and fuses, when the pickup tool is holding the semiconductor chip.

If the chip pads and fuses are configured along the center lines on the top surface of a semiconductor chip, the passivation layer on the chip is divided into four sections in order to expose the chip pads and the fuses. A pickup tool for this case may include four contact parts, each of which corresponds to a section of the passivation layer.

A die bonding apparatus according to the present invention may include two pickup tools. A first pickup tool picks up a semiconductor chip from a sawed wafer and puts it on an aligning stage. A second pickup tool picks up the chip from the aligning stage and puts it on the lead frame. The aligning stage or its top surface is preferably made of an electrically nonconductive material.

Another die bonding apparatus according to the present invention includes one pickup tool. This pickup tool picks up a semiconductor chip and puts it on an aligning stage. Then, the aligning stage transfers the semiconductor chip to underneath of a lead frame and pushes up the semiconductor chip to the lead frame. A bond head presses the lead frame so as to bond the lead frame to the semiconductor chip while the aligning stage support the semiconductor chip.

DETAILED DESCRIPTION OF THE PRESENT INVENTION

Figure 1:
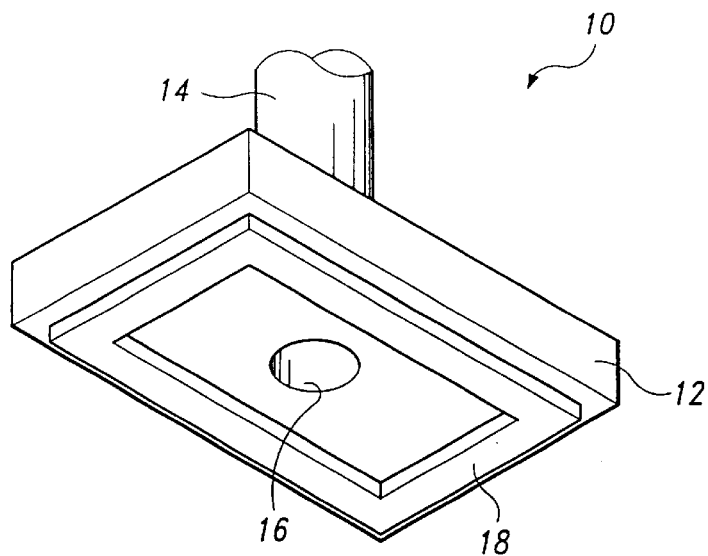
FIG. 1 is a perspective view of a conventional pickup collet.
Figure 2:
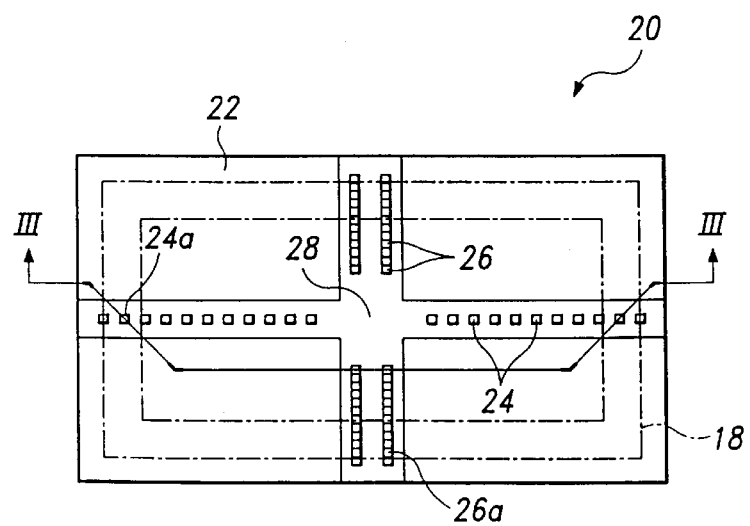
FIG. 2 is a plan view of a top surface of a semiconductor chip.

The present invention will be described in detail hereinafter with reference to accompanying drawings, which show embodiments of the invention. This invention may, however, be embodied in many different forms and should not be construed as limited to the embodiments set forth herein; rather, these embodiments are illustrative. In the drawings, like numbers refer to like elements.

Figure 5:
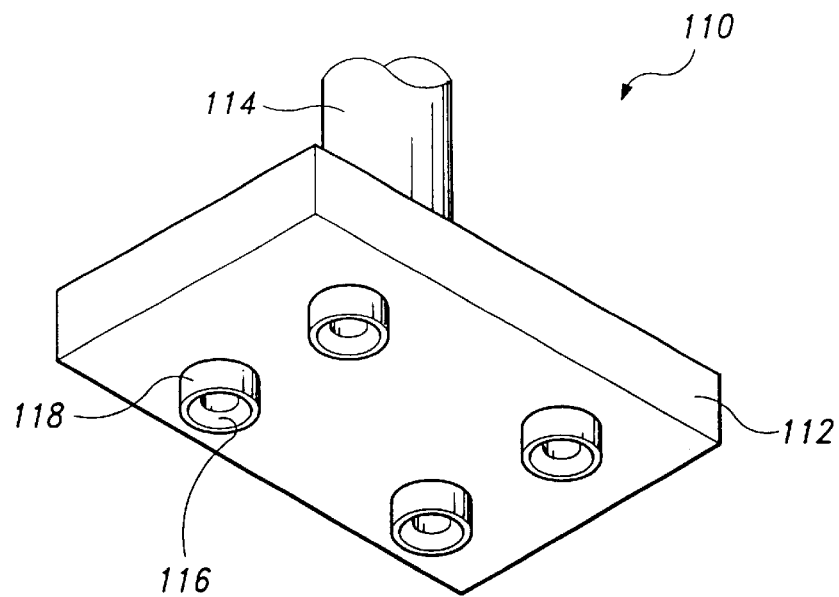
FIG. 5 is a perspective view of a pickup tool in accordance with the present invention.
Figure 6:
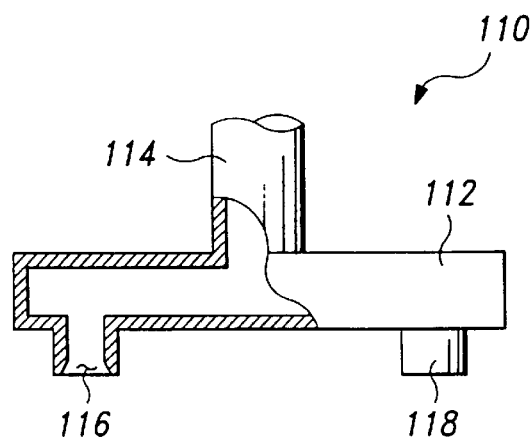
FIG. 6 is a partial cross-sectional view the pickup tool of FIG. 5.

FIG. 5 is a perspective view of a pickup tool 110 in accordance with the present invention, and FIG. 6 is a partial cross-sectional view of pickup tool 110 of FIG. 5. Referring to FIGS. 5 and 6, pickup tool 110 includes a body 112 and a tubular vacuum line 114 connected to body 112. In particular, pickup tool 110 has multiple contact parts 118. Each contact part 118 protrudes from body 112, being spaced apart from each of the other contact parts 118. Also, each contact part 118 has a vacuum hole 116 which communicates with a hole in vacuum line 114, and the hole in vacuum line 114 and vacuum holes 116 are connected inside body 112. Vacuum line 114 is used for creating a vacuum between semiconductor chip 20 and contact parts 118 so that contact parts 118 hold semiconductor chip 20. Further, contact parts 118 contact passivation layer 22 of semiconductor chip 20 as shown in FIG. 7, and do not contact chip pads 24 and fuses 26.

Passivation layer 22 partially covers top surface 28 of semiconductor chip 20, with chip pads 24 and fuses 26 being exposed. FIG. 7 shows the contact area 119 between top surface 28 of semiconductor chip 20 and contact pads 118 or the pickup tool 110 shown in FIGS. 5 and 6. If, as shown in FIG. 7, chip pads 24 and fuses 26 are located along center lines of top surface 28, and passivation layer 22 is divided into four sections or quadrants to expose chip pads 24 and fuses 26, pickup tool 110 has contact parts 118 so that each contact part 118 contacts a corresponding section of passivation layer 22. The design of pickup tool 110, for example, the number, location, size and shape of contact parts 118, can be varied according to the location of passivation layer 22.

Figure 3:
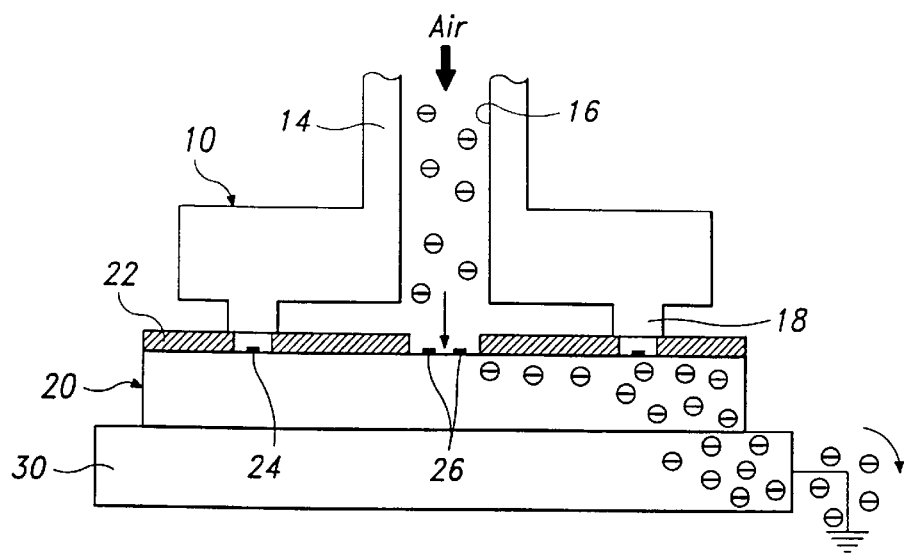
FIG. 3 is a schematic view illustrating one example of electrostatic discharge caused by the conventional pickup collet.
Figure 4:
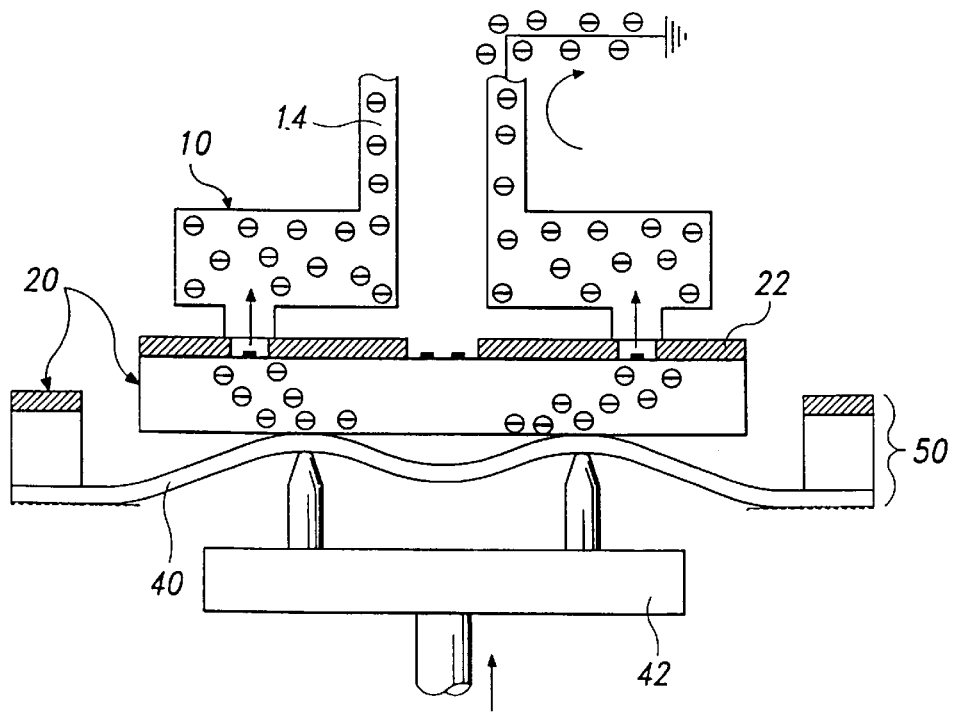
FIG. 4 is a schematic view illustrating another example of electrostatic discharge caused by the conventional pickup collet.
Figure 7:
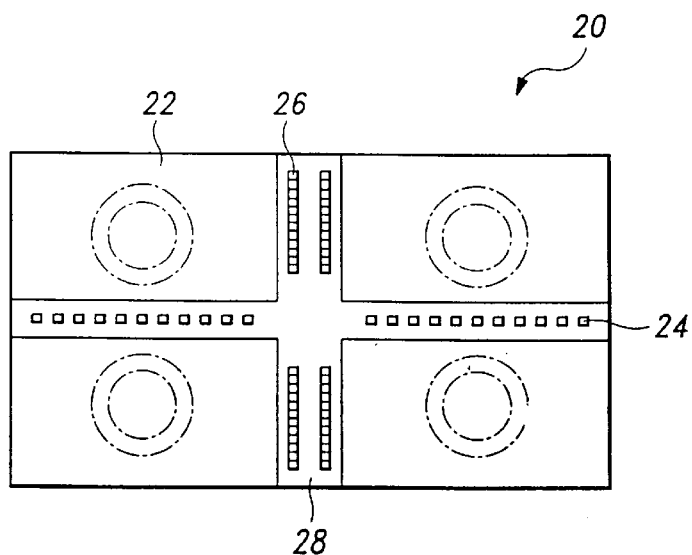
FIG. 7 is a plan view showing the contact area between a top surface of a semiconductor chip and the pickup tool of FIG. 5.

With reference to FIGS. 5, 6 and 7, contact parts 118 are apart from chip pads 24 and fuses 26 when holding semiconductor chip 20. Accordingly, electric charges in the air or nitrogen gas, which flows through vacuum line 114 and vacuum holes 116, cannot flow toward chip pads 24 or fuses 26 as shown in FIG. 3. Further, contrary to the case of FIG. 4, the electric charges generated in the gap between sawing tape 40 and semiconductor chip 20 cannot flow toward contact parts 118 of pickup tool 110. That is, damages to semiconductor chip 20 by electrostatic discharge is effectively prevented.

In addition to the pickup tool that was described with reference to FIGS. 5, 6 and 7, the present invention also provides a bonding apparatus having the pickup tool. Two exemplary embodiments of the die bonding apparatus having the pickup tool according to the present invention are schematically illustrated in FIGS. 8 and 9.

Figure 8:
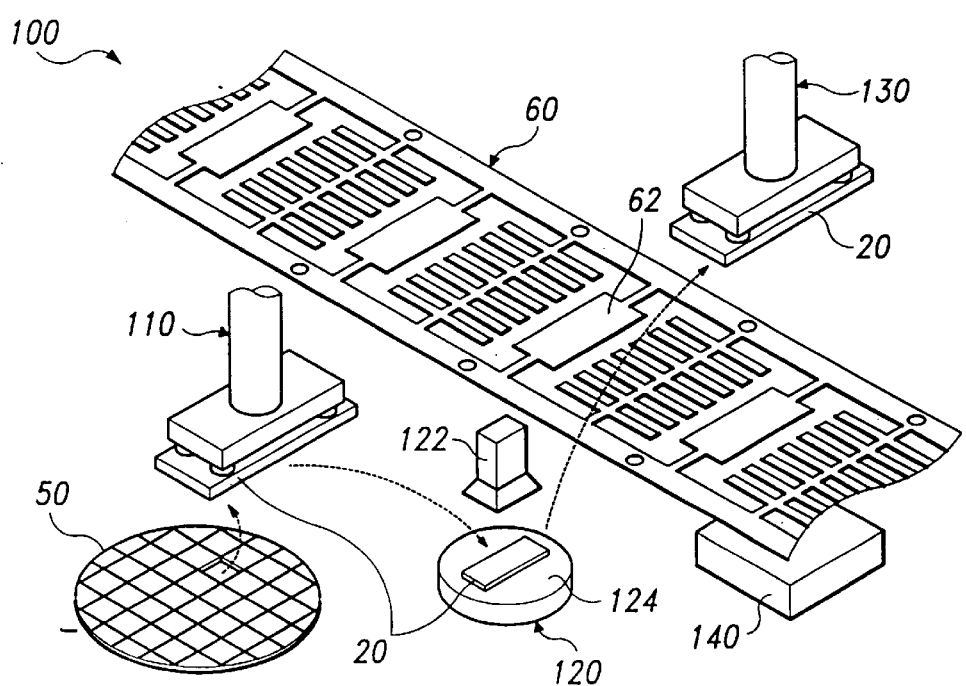
FIG. 8 is a schematic view illustrating an operation of a die bonding apparatus in accordance with the present invention.
Figure 9:
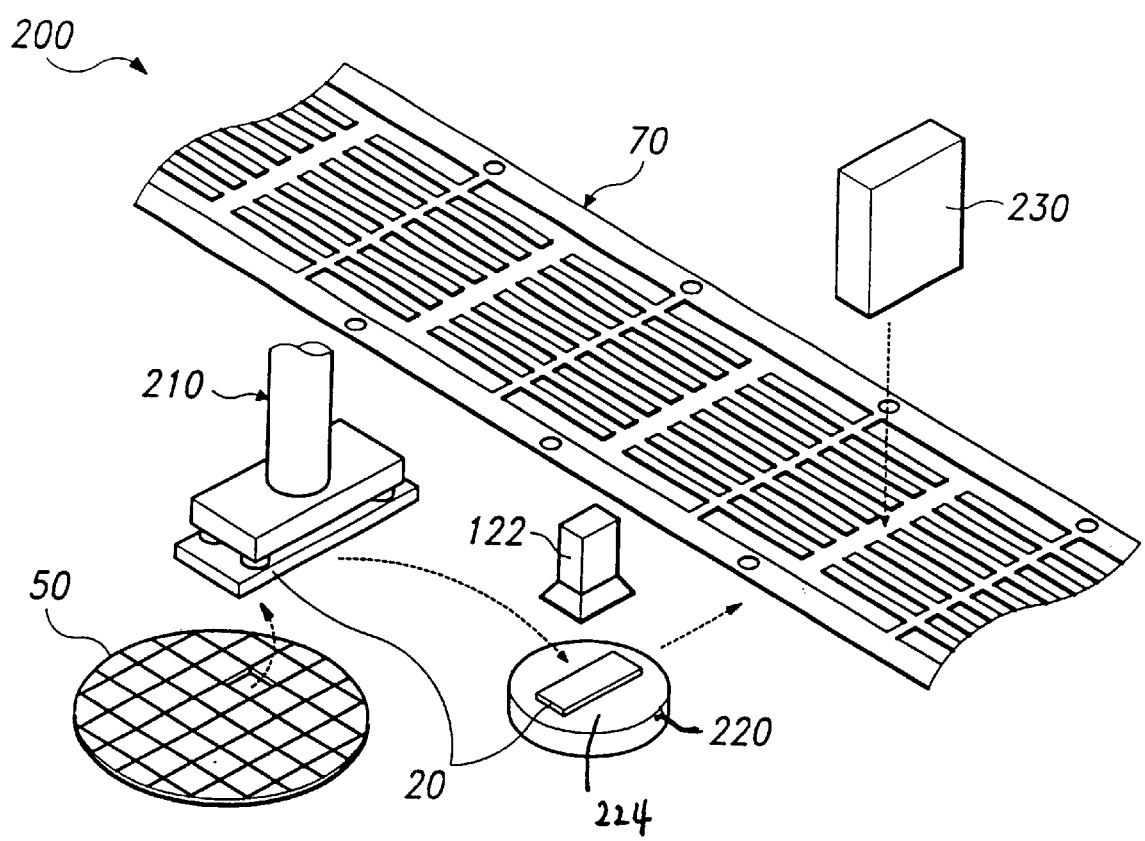
FIG. 9 is a schematic view illustrating an operation of another die bonding apparatus in accordance with the present invention.

A first embodiment of die bonding apparatus according to the present invention is depicted in FIG. 8. Die attaching apparatus 100 has two pickup tools 110 and 130. A first pickup tool 110 picks up semiconductor chip 20 from sawed wafer 50 and then puts semiconductor chip 20 on an aligning stage 120. Then, an optical instrument 122 such as a camera detects a misalignment of semiconductor chip 20. Based on the information from optical instrument 122, aligning stage 120 moves rotationally and along X-Y axis to align semiconductor chip 20 correctly. After the alignment is done, a second pickup tool 130 picks up aligned semiconductor chip 20 and places semiconductor chip 20 on a die pad 62 of a lead frame 60. The attaching apparatus except for two pickup tools 110 and 130 described in the embodiment in FIG. 8 are available in conventional die bonders such as Model PA100 from Shinkawa Company in Japan, and Model AT3000 Series from Hitachi Tokyo Electron Company in Japan.

Before placing semiconductor chip 20 on die pad 62, die bonding apparatus 100 dispenses die adhesive (not shown) on die pad 62. For bonding semiconductor chip, second pickup tool 130 pushes semiconductor chip 20 down while a bonding stage 140 supports the bottom of semiconductor chip 20. Bond stage 140 is kept at an elevated temperature for effective die bonding.

Even though pickup tools 110 and 130 having multiple contact parts, such as contact parts 118 in FIG. 5, can prevent undesirable ESD, an electrically conductive aligning stage 120 may result in electrostatic discharge, as electric charges in semiconductor chip 20 flow toward aligning stage 120. In order to prevent this electric charge flow, top surface 124 of aligning stage 120 is preferably made of an electrically nonconductive material.

A second embodiment of die bonding apparatus according to the present invention is depicted in FIG. 9. A die attaching apparatus 200 in FIG. 9 has a single pickup tool 210. Pickup tool 210 of this apparatus performs the same function as pickup tool 110 in FIG. 8, namely, transferring semiconductor chip 20 from sawed wafer 50 to aligning stage 220. However, there are some differences between two apparatuses in FIGS. 8 and 9 in a process after the die alignment.

Apparatus 200 of FIG. 9 employs aligning stage 220 which moves to a lead frame 70. That is, after receiving and aligning semiconductor chip 20 like aligning stage 120 in FIG. 8, aligning stage 220 moves and stops under lead frame 70. Then, a bond head 230 pushes lead frame 70 down, and at the same time, aligning stage 220 moves upward to create a bond between semiconductor chip 20 and lead frame 70. In this case, generally, adhesive has been already applied to the bonded surface of lead frame 70. The die attaching apparatus except for pickup tool 210 described in the embodiment in FIG. 9 are available in conventional die bonders such as Model LOC3 and LOC5 from Shinkawa Company in Japan, and Model LN100 and LN 150 from Hitachi Tokyo Electron Company in Japan.

Bond head 230 or/and aligning stage 220 are usually heated for easy die bonding. Like aligning stage 110, aligning stage 220 or the top surface 224 of aligning stage 220 is preferably made of an electrically nonconductive material.

The movement of the pickup tools in two die bonding apparatuses 100 and 200 described above may be actually controlled by a robot arm or other equivalent means. However, the description of the robot arm movement is omitted herein since it is widely known in the art. For similar reasons, detailed descriptions of aligning stage, bond stage, bond head, and lead frame are omitted.

In the drawings and specification, there have been disclosed typical embodiments of the present invention and, although specific terms are employed, they are used to explain, in a generic and descriptive sense only and not for purposes of limitation, the scope of the invention being set forth in the following claims.

What is claimed is:

1. A method for picking up a semiconductor device having an exposed electrical structure, the method comprising:

selecting a pickup tool having contact portions in a pattern that avoids the exposed electrical structure;

moving the pickup tool into proximity with the semiconductor device;

applying an attractive force that holds the semiconductor device in contract with the contact portions, wherein the pattern of the contact portions of the pickup tool causes the pick up tool to avoid contact with the exposed electrical structure.

2. The method of claim 1, wherein selecting the pickup tool selects a pickup tool that maintains separations between the contact portions and the exposed electrical structure that are sufficient to avoid electrostatic discharge between the contact portions and the exposed electrical structure.

3. The method of claim 1, wherein applying the attractive force causes the contact portions to only contact a passivation layer on the semiconductor device.

4. The method of claim 3, wherein the exposed electrical structure comprises one or more pad exposed through an opening in the passivation layer.

5. The method of claim 1, wherein applying the attractive force comprises applying a vacuum through openings in the contact portions.

* * * * *